(12) United States Patent
Kotler et al.

(10) Patent No.: US 9,925,797 B2
(45) Date of Patent: Mar. 27, 2018

(54) LIFT PRINTING SYSTEM

(71) Applicant: ORBOTECH LTD., Yavne (IL)

(72) Inventors: Zvi Kotler, Tel Aviv (IL); Michael Zenou, Hashmonain (IL); Itay Peled, Jerusalem (IL)

(73) Assignee: ORBOTECH LTD., Yavne (IL)

( * ) Notice: Subject to any disclaimer, the term of this patent is extended or adjusted under 35 U.S.C. 154(b) by 0 days.

(21) Appl. No.: 15/326,498

(22) PCT Filed: Aug. 2, 2015

(86) PCT No.: PCT/IB2015/055862
§ 371 (c)(1),
(2) Date: Jan. 16, 2017

(87) PCT Pub. No.: WO2016/020817
PCT Pub. Date: Feb. 11, 2016

(65) Prior Publication Data
US 2017/0210142 A1 Jul. 27, 2017

Related U.S. Application Data

(60) Provisional application No. 62/034,168, filed on Aug. 7, 2014.

(51) Int. Cl.
*B41J 2/455* (2006.01)

(52) U.S. Cl.
CPC .................... *B41J 2/455* (2013.01)

(58) Field of Classification Search
CPC ... B41J 33/14; B41J 2/455; B41J 11/42; B41J 11/51; B41J 13/0009; B41J 13/0027
See application file for complete search history.

(56) References Cited

U.S. PATENT DOCUMENTS

| 1,393,637 A | 10/1921 | Ohashi |
| 4,608,328 A | 8/1986 | Schwartz et al. |
| 4,752,455 A | 6/1988 | Mayer |

(Continued)

FOREIGN PATENT DOCUMENTS

| EP | 1847632 A1 | 10/2007 |
| EP | 2660352 A1 | 11/2013 |

(Continued)

OTHER PUBLICATIONS

Pique et al., "Laser Forward Transfer of Electronic and Power Generating Materials", Laser Ablation and its Applications, Chapter 14, pp. 339-373, Dec. 31, 2007.

(Continued)

*Primary Examiner* — Kristal Feggins
(74) *Attorney, Agent, or Firm* — D. Kligler IP Services Ltd.

(57) ABSTRACT

Printing apparatus (20) includes a donor supply assembly (30), which provides a transparent donor substrate (26) having opposing first and second surfaces and a donor film formed on the second surface so as to position the donor film in proximity to a target area (28) on an acceptor substrate (22). An optical assembly (24) directs multiple output beams of laser radiation simultaneously in a predefined spatial pattern to pass through the first surface of the donor substrate and impinge on the donor film so as to induce ejection of material from the donor film onto the acceptor substrate according, thereby writing the predefined pattern onto the target area of the acceptor substrate.

26 Claims, 4 Drawing Sheets

(56) References Cited

U.S. PATENT DOCUMENTS

| | | |
|---|---|---|
| 4,891,183 A | 1/1990 | Corwin |
| 4,970,196 A | 11/1990 | Kim et al. |
| 4,987,006 A | 1/1991 | Williams et al. |
| 5,090,828 A | 2/1992 | Shimura et al. |
| 5,137,382 A | 8/1992 | Miyajima |
| 5,173,441 A | 12/1992 | Yu et al. |
| 5,204,696 A | 4/1993 | Schmidlin et al. |
| 5,292,559 A | 3/1994 | Joyce, Jr. et al. |
| 5,492,861 A | 2/1996 | Opower |
| 5,683,601 A | 11/1997 | Tatah |
| 5,692,844 A | 12/1997 | Harrison et al. |
| 5,885,929 A | 3/1999 | Brock et al. |
| 5,935,758 A | 8/1999 | Patel et al. |
| 6,025,110 A | 2/2000 | Nowak |
| 6,155,330 A | 12/2000 | Kinane et al. |
| 6,159,832 A | 12/2000 | Mayer |
| 6,177,151 B1 | 1/2001 | Chrisey et al. |
| 6,261,493 B1 | 1/2001 | Gaylo et al. |
| 6,412,143 B1 | 7/2002 | Chen |
| 6,440,503 B1 | 8/2002 | Merdan et al. |
| 6,583,381 B1 | 6/2003 | Duignan |
| 6,649,861 B2 | 11/2003 | Duignan |
| 6,792,326 B1 | 9/2004 | Duignan et al. |
| 6,805,918 B2 | 10/2004 | Auyeung et al. |
| 6,815,015 B2 | 11/2004 | Young et al. |
| 6,822,189 B2 | 11/2004 | Hong et al. |
| 6,896,429 B2 | 5/2005 | White et al. |
| 6,899,988 B2 | 5/2005 | Kidnie et al. |
| 7,236,334 B2 | 6/2007 | Ding et al. |
| 7,277,770 B2 | 10/2007 | Huang et al. |
| 7,358,169 B2 | 4/2008 | Zhu et al. |
| 7,364,996 B2 | 4/2008 | Kawase et al. |
| 7,423,286 B2 | 9/2008 | Handy et al. |
| 7,534,543 B2 | 5/2009 | Kreilich et al. |
| 7,534,544 B2 | 5/2009 | Principe et al. |
| 7,608,308 B2 | 10/2009 | Liu et al. |
| 7,784,173 B2 | 8/2010 | Wolkin et al. |
| 7,799,699 B2 | 9/2010 | Nuzzo et al. |
| 7,938,855 B2 | 5/2011 | Gregorich et al. |
| 7,942,987 B2 | 5/2011 | Crump et al. |
| 7,982,296 B2 | 9/2011 | Nuzzo et al. |
| 8,025,542 B2 | 9/2011 | Birrell et al. |
| 8,056,222 B2 | 11/2011 | Pique et al. |
| 8,215,371 B2 | 7/2012 | Batchelder et al. |
| 8,216,931 B2 | 7/2012 | Zhang |
| 8,221,822 B2 | 7/2012 | Flanagan et al. |
| 8,262,916 B1 | 9/2012 | Smalley et al. |
| 8,395,083 B2 | 3/2013 | Naveh et al. |
| 8,420,978 B2 | 4/2013 | Jain et al. |
| 8,440,546 B2 | 5/2013 | Nuzzo et al. |
| 8,535,041 B2 | 9/2013 | Slafer |
| 8,545,931 B2 | 10/2013 | Szuch |
| 8,574,615 B2 | 11/2013 | Tenney et al. |
| 8,729,524 B2 | 5/2014 | Rogers et al. |
| 8,741,194 B1 | 6/2014 | Ederer et al. |
| 8,743,165 B2 | 6/2014 | Sandstriim |
| 9,027,378 B2 | 5/2015 | Crump et al. |
| 9,029,058 B2 | 5/2015 | Martin |
| 9,044,805 B2 | 6/2015 | Prest et al. |
| 9,446,618 B2 | 9/2016 | Batt et al. |
| 2002/0085085 A1 | 7/2002 | Fischer et al. |
| 2003/0006534 A1 | 1/2003 | Taboas et al. |
| 2004/0069471 A1 | 4/2004 | Corduan et al. |
| 2004/0233408 A1 | 11/2004 | Sievers |
| 2005/0056626 A1 | 3/2005 | Gross et al. |
| 2005/0095367 A1 | 5/2005 | Babiarz et al. |
| 2005/0112015 A1 | 5/2005 | Bampton |
| 2005/0211163 A1 | 9/2005 | Li et al. |
| 2005/0212888 A1 | 9/2005 | Lehmann et al. |
| 2007/0203584 A1 | 8/2007 | Bandyopadhyay et al. |
| 2008/0006966 A1 | 1/2008 | Mannella |
| 2008/0041725 A1 | 2/2008 | Klein et al. |
| 2008/0233291 A1 | 9/2008 | Chandrasekaran |
| 2008/0286488 A1 | 11/2008 | Li et al. |
| 2009/0074987 A1 | 3/2009 | Auyeung et al. |
| 2009/0217517 A1 | 9/2009 | Pique et al. |
| 2010/0022078 A1 | 1/2010 | Rockenberger et al. |
| 2010/0100635 A1 | 9/2010 | Gold et al. |
| 2011/0097550 A1 | 4/2011 | Matusovsky et al. |
| 2011/0136162 A1 | 6/2011 | Sun et al. |
| 2011/0188016 A1 | 8/2011 | De Jager et al. |
| 2012/0080088 A1 | 4/2012 | Grabitz et al. |
| 2012/0247740 A1 | 10/2012 | Gertner et al. |
| 2013/0029480 A1 | 1/2013 | Niklaus et al. |
| 2013/0176699 A1 | 7/2013 | Tonchev et al. |
| 2013/0302154 A1 | 11/2013 | Finlayson |
| 2013/0313756 A1 | 11/2013 | Chen et al. |
| 2013/0335504 A1 | 12/2013 | Sandstrom et al. |
| 2014/0097277 A1 | 4/2014 | Kumta et al. |
| 2014/0160452 A1 | 6/2014 | De Jaget et al. |
| 2014/0231266 A1 | 8/2014 | Sherrer et al. |
| 2014/0238574 A1 | 8/2014 | Kinser et al. |
| 2015/0024317 A1 | 1/2015 | Orrock et al. |
| 2015/0024319 A1 | 1/2015 | Martin |
| 2015/0086705 A1 | 3/2015 | Meinders et al. |
| 2015/0167147 A1 | 6/2015 | Schupp et al. |
| 2015/0197063 A1 | 7/2015 | Shinar et al. |
| 2015/0197862 A1 | 7/2015 | Engel et al. |
| 2015/0328838 A1 | 11/2015 | Erb et al. |
| 2015/0097316 A1 | 12/2015 | Desimone et al. |
| 2015/0382476 A1 | 12/2015 | Zenou et al. |
| 2016/0218287 A1 | 7/2016 | McAlpine et al. |
| 2016/0336303 A1 | 11/2016 | Tsai |

FOREIGN PATENT DOCUMENTS

| | | |
|---|---|---|
| GB | 2453774 A | 4/2009 |
| JP | H0634283 A | 2/1994 |
| JP | 3871096 B2 | 1/2007 |
| JP | 2015144252 A | 8/2015 |
| WO | 2003056320 A2 | 7/2003 |
| WO | 2007134300 A2 | 11/2007 |
| WO | 2010100635 A1 | 9/2010 |
| WO | 2013023874 A1 | 2/2013 |
| WO | 2013080030 A1 | 6/2013 |
| WO | 2013124114 A1 | 8/2013 |
| WO | 2014061024 A1 | 4/2014 |
| WO | 2015056253 A1 | 4/2015 |
| WO | 2015155662 A1 | 10/2015 |
| WO | 2015181810 A1 | 12/2015 |
| WO | 2016063270 A1 | 4/2016 |
| WO | 2016116921 A1 | 7/2016 |
| WO | 20160124708 A1 | 8/2016 |
| WO | 20160124712 A3 | 8/2016 |
| WO | 2017006306 A1 | 1/2017 |

OTHER PUBLICATIONS

Young et al., "Dielectric properties of oxide structures by a laser-based direct-writing method", Journal of Materials Research, vol. 16, number, pp. 1720-1725, Jun. 30, 2001.

Nagel et al., "Laser-Induced Forward Transfer for the Fabrication of Devices", Nanomaterials: Processing and characterization with Lasers, First Edition, pp. 255-316, year 2012.

Papavlu et al.,"Laser Induced Forward Transfer for Materials Patterning", Romanian Reports in Physics, vol. 63, supplement, pp. 1285-1301, year 2011.

Zergioti et al., "Microdeposition of metals by femtosecond excimer lase", Applied Surface Science, vols. 127-129, pp. 601-605, year 1998.

Vispute et al., "Reactive deposition of YlBa2Cu30 7-x superconductor films by pulsed laser ablation from an unreacted mixture of Y2O3, BaCO 3 and CuO", Bulletin of Materials Science, vol. 15, No. 4, pp. 377-384, Aug. 1992.

Hecht.,"Multifrequency Acoustooptic Diffraction," IEEE Transactions on Sonics and Ultrasonics, vol. SU-24, No. 1, pp. 7-18, year 1977.

Trypogeorgos et al., "Precise shaping of laser light by an acousto-optic deflector", Optics Express, vol. 21, No. 21, pp. 24837-24846, Oct. 21, 2013.

(56) References Cited

OTHER PUBLICATIONS

International Application # PCT/IB2015/055862 Search Report dated Nov. 18, 2005.
International Application # PCT/IL2015/000027 Search Report dated Sep. 9, 2015.
Baseman.,"Formation of Metal Silicon Alloys by Laser Induced Forward Transfer", An IP.com Prior Art Database Technical Disclosure, 2 pages, Jul. 1, 1988.
Gehner., "MEMS Adaptive Optics Development at IPMS", Fraunhofer, Feb. 15, 2007.
Kumpulainen et al., "Low Temperature Nanoparticle Sintering with Continuous Wave and Pulse Lasers", Optics & Laser Technology 43, pp. 570-576, year 2011.
Theodorakos et al., "Selective Laser Sintering of Ag Nanoparticles Ink for Applications in Flexible Electronics", Applied Surface Science 336, pp. 157-162, 2015.
Wang et al., "Silicon solar cells based on all-laser-transferred contacts", Progress in Photovoltaics: Research and Applications, 23, pp. 61-68 Jul. 19, 2013.
Willis et al., "Microdroplet deposition by laser-induced forward transfer", Applied Physics Letters, vol. 86, pp. 244103-1-244103-3, year 2005.
Antonov., "Angular Splitting of the Bragg Diffraction Order in an Acoustooptical Modulator Due to a Frequency-Modulated Acoustic Wave", Technical Physics, vol. 50, No. 4, pp. 513-516, year 2005.
Banks et al., "Nanodroplets deposited in microarrays by femtosecond Ti:sapphire laser-induced forward transfer", Applied Physics Letters, vol. 89, pp. 193107-1-193107-3, year 2006.
Antonov., "Acoustooptic Nonpolar Light Controlling Devices and Polarization Modulators Based on Paratellurite crystals", Technical Physics, vol. 49, No. 10, pp. 1329-1334, year 2004.
Antonov et al., "Improving the Efficiency of an Acoustooptic Modulator with a Two-Lobe Directivity Pattern by correcting the Two-Frequency Electric Signal", ISSN 1063-7842, Technical Physics, vol. 51, No. 1, pp. 57-52, year 2006.
Antonov et al., "Inverse Acoustooptic Problem: Coherent Summing of Optical Beams into a Single Optical Channel", ISSN 1063-7842, Technical Physics, vol. 52, No. 5, pp. 610-615, year 2007.
Antonov et al., "Efficient Multiple-Beam Bragg Acoustooptic Diffraction with Phase Optimization of a Multifrequency Acoustic Wave", ISSN 1063-7842, Technical Physics, vol. 52, No. 8, pp. 1053-1060, year 2007.
Antonov et al., "Formation of the Multibeam Pattern of the Bragg Diffraction of Light by a Periodically Phase Modulated Acoustic Signal", ISSN 1064-2269, Journal of Communications Technology and Electronics, vol. 53, No. 4, pp. 453-459, year 2008.
Antonov et al., "Highly Effective Acoustooptic Diffraction of Light by Multifrequency Sound Using a Nonaxial Deflector", ISSN 1063-7842, Technical Physics, vol. 53, No. 6, pp. 752-756, year 2008.
Antonov et al., "Switch multiplexer of fiber-optic channels based on multibeam acousto-optic diffraction", Applied Optics, vol. 48, No. 7, pp. C171-C181, Mar. 1, 2009.
Zenou et al., "Laser Transfer of Metals and Metal Alloys for Digital Microfabrication of 3D Objects", SMALL, vol. 11, issue 33, pp. 4082-4089, Sep. 2, 2015.
Zenou et al., "Solar cell metallization by laser transfer of metal micro-droplets", ScienceDirect, Energy Procedia, vol. 67, pp. 147-155, year 2015.
Bera et al., "Optimization study of the femtosecond laser-induced forward-transfer process with thin aluminum films", Applied Optics, vol. 46, No. 21, pp. 4650-4659, Jul. 20, 2007.
Li et al., "Microdroplet deposition of copper film by femtosecond laser-induced forward transfer", Applied Physics Letters, vol. 89, pp. 161110-4-161110-4, year 2006.
Roder et al., "Low Temperature Laser Metallization for Silicon Solar Cells", ScienceDirect, Energy Procedia, vol. B, pp. 552-557, year 2011.
Tien et al., "Precision laser metallization", Microelectronic Engineering, vol. 56, pp. 273-279, year 2001.
Fraunhofer IPMS, Spatial Light Modulators (SLM), 2 pages, Jun. 7, 2016.
Fraunhofer IPMS, "Micro Mirror Arrays (MMA) from DUV to NIR", 2 pages, Jun. 7, 2016.
Gehner et al., "Mems AO Micro Mirror Development at IPMS", Status and Perspectives, Fraunhofer IPMS, 30 pages, May 4, 2016.
BWT Beijing, "K915FG2RN-150.0W, 915nm 150W High Power Fiber Coupled Diode Laser", 4 pages, Jul. 1, 2016.
Zenou et al., "Digital laser printing of aluminum microstructure on thermally sensitive substrates", Journal of Physics D: Applied Physics 48, 205303 12 pages, 2015.
Willis et al., "The effect of melting-induced volumetric expansion on initiation of laser-induced forward transfer", Applied Surface Science 253, pp. 4759-4763, 2007.
Schultze et al., "Laser-induced forward transfer of aluminium", Applied Surface Science 52, pages 303-309, 1991.
Pique, A., "Laser Transfer Techniques for Digital Microfabrication", vol. 135 of the series Springer Series in Materials Science, Chapter 11, pp. 259-291, Jun. 30, 2010.
Bohandy et al., "Metal deposition from a supported metal film using an excimer laser", Journal of Applied Physics, vol. 60, No. 4, pp. 1538-1539, Aug. 15, 1986.
Adrian et al., "A study of the mechanism of metal deposition by the laser-induced forward transfer process", Journal of Vacuum Science and Technology B, vol. 5, No. 5, pp. 1490-1494, Sep./Oct. 1987.
Tan et al., "Selective surface texturing using femtosecond pulsed laser induced forward transfer", Applied Surface Scienc, vol. 207, pp. 365-371, year 2003.
Grant-Jacob et al., "Micron-scale copper wires printed using femtosecond laser-induced forward transfer with automated donor replenishment", Optical Materials Express, vol. 3, No. 6, pp. 747-754, Jun. 1, 2013.
Eason et al., "Nanofabrication technologies: high-throughput for tomorrow's metadevices", Conference paper, University of Southampton, UK, 50 pages, Jan. 2014.
Xiao., "Nanosecond Laser Assisted Fabrication of Large Area Metallic Nanostructures and Their Potential Applications", Thesis dissertation, University of California, Los Angeles, 98 pages, 2015.

LIFT PRINTING SYSTEM

CROSS-REFERENCE TO RELATED APPLICATION

This application claims the benefit of U.S. Provisional Patent Application 62/034,168, filed Aug. 7, 2014.

FIELD OF THE INVENTION

The present invention relates generally to laser-induced material transfer, and particularly to methods and apparatus for printing of material from a flexible donor substrate onto an acceptor substrate.

BACKGROUND

In laser direct-write (LDW) techniques, a laser beam is used to create a patterned surface with spatially-resolved three-dimensional structures by controlled material ablation or deposition. Laser-induced forward transfer (LIFT) is an LDW technique that can be applied in depositing micropatterns on a surface.

In LIFT, laser photons provide the driving force to catapult a small volume of material from a donor film toward an acceptor substrate. Typically, the laser beam interacts with the inner side of the donor film, which is coated onto a non-absorbing carrier substrate. The incident laser beam, in other words, propagates through the transparent carrier before the photons are absorbed by the inner surface of the film. Above a certain energy threshold, material is ejected from the donor film toward the surface of the substrate.

Some LIFT-based printing systems have been described in the patent literature. For example, U.S. Patent Application Publication 2005/0212888 describes a printing process for the transfer of a printing substance from an ink carrier to an imprinting material with the help of an energy-emitting apparatus, such as a laser, which emits electromagnetic waves.

LIFT processes may be used to transfer various materials from a donor to a receiving substrate. For example, U.S. Patent Application Publication 2009/0074987 describes the use of laser decal transfer to generate thin film features by directing laser pulses of very low energy to illuminate an area of a thin layer of a high-viscosity rheological fluid. The decal transfer process is said to allow for the release and transfer to the receiving substrate of a uniform and continuous layer identical in shape and size to the laser-irradiated area of the target substrate. The released layer is transferred with almost no change to its initial size and shape.

SUMMARY

Embodiments of the present invention that are described hereinbelow provide apparatus and methods for flexible, efficient LIFT-based printing.

There is therefore provided, in accordance with an embodiment of the present invention, printing apparatus, including a donor supply assembly, which is configured to provide a transparent donor substrate having opposing first and second surfaces and a donor film formed on the second surface so as to position the donor film in proximity to a target area on an acceptor substrate. An optical assembly is configured to direct multiple output beams of laser radiation simultaneously in a predefined spatial pattern to pass through the first surface of the donor substrate and impinge on the donor film so as to induce ejection of material from the donor film onto the acceptor substrate according, thereby writing the predefined pattern onto the target area of the acceptor substrate.

The donor film may include, for example, a metal or a rheological material.

In some embodiments, the optical assembly includes a laser, which is configured to emit a single input beam, and optics configured to split the single input beam into the multiple output beams and to direct the multiple output beams in accordance with the predefined spatial pattern. In disclosed embodiments, the optics include an acousto-optic deflector, which is positioned so as to intercept the input beam, and a driver, which is configured to provide a multi-frequency drive to the acousto-optic deflector so as deflect the multiple output beams at different, respective angles. In one embodiment, the acousto-optic deflector is configured to deflect the multiple output beams at the respective angles along a first direction, and the optics include at least one scanning mirror, which is configured to deflect the multiple output beams in a second direction, orthogonal to the first direction. In another embodiment, the acousto-optic deflector that receives the multi-frequency drive includes a first acousto-optic deflector, which is configured to deflect the multiple output beams at the respective angles along a first direction, and the optics include a second acousto-optic deflector, which is configured to cause the multiple output beams to scan over the donor film in a second direction, orthogonal to the first direction.

In the disclosed embodiments, the apparatus includes a positioning assembly, which is configured to shift at least one of the donor substrate and the acceptor substrate in order to position a first donor area of the donor film in proximity to a first target area of the acceptor substrate, so that the multiple output beams write a first predefined spatial pattern onto the first target area, and subsequently to position at least one second donor area of the donor film, different from the first donor area, in proximity to at least one second target area of the acceptor substrate, different from the first target area, so that the multiple output beams write at least one second predefined spatial pattern onto the second target area.

In some embodiments, the positioning assembly is configured to hold the donor and acceptor substrates in fixed, first and second relative positions while the optical assembly writes the first and second spatial patterns, respectively, as two-dimensional arrays of spots on the first and second target areas of the acceptor substrate.

Additionally or alternatively, the positioning assembly and donor supply assembly are configured to cause a relative shift between the donor and acceptor substrates as the optical assembly writes successive lines of the first and second spatial patterns.

Further additionally or alternatively, the positioning assembly is configured to successively position at least first and second donor areas of the donor film in proximity to at least the first target area, and the optical assembly is configured to direct the multiple output beams over the first and second donor areas in respective first and second spatial patterns so as to write a multi-layer pattern on at least the first target area.

Typically, the donor substrate includes a continuous flexible foil, and the donor supply assembly includes feed rollers, which are configured to feed the foil across the target area. In some embodiments, the donor supply assembly includes a coating module, which is configured to apply at least a component of the donor film to a first area of the continuous flexible foil while a second area of the continuous flexible foil, to which the donor film has already been applied, is fed across the target area. The coating module may include a reservoir containing a donor material and a gravure cylinder, which is configured to apply a layer of the donor material from the reservoir to the first area of the foil in order to form the donor film. Additionally or alternatively, the coating module may be configured to apply different, respective donor materials to alternating areas of the foil in succession. In another embodiment, the donor film includes a first donor material, which is pre-coated on the foil, and wherein the coating module is configured to apply a second donor material to the pre-coated foil, so that the donor film comprises the first and second donor materials.

There is also provided, in accordance with an embodiment of the present invention, a method for printing, which includes positioning a transparent donor substrate, having opposing first and second surfaces and a donor film formed on the second surface, in proximity to a target area on an acceptor substrate. Multiple output beams of laser radiation are directed simultaneously in a predefined spatial pattern to pass through the first surface of the donor substrate and impinge on the donor film so as to induce ejection of material from the donor film onto the acceptor substrate according, thereby writing the predefined pattern onto the target area of the acceptor substrate.

There is additionally provided, in accordance with an embodiment of the present invention, printing apparatus, including a donor supply assembly, which is configured to provide a transparent donor substrate having opposing first and second surfaces and a donor film formed on the second surface so as to position the donor film in proximity to a target area on an acceptor substrate. An optical assembly, including a laser and an acousto-optic deflector, is configured to direct at least one output beam of radiation from the laser in a predefined spatial pattern to pass through the first surface of the donor substrate and impinge on the donor film so as to induce ejection of material from the donor film onto the acceptor substrate according, thereby writing the predefined pattern onto the target area of the acceptor substrate.

The present invention will be more fully understood from the following detailed description of the embodiments thereof, taken together with the drawings in which:

DETAILED DESCRIPTION OF EMBODIMENTS

Figure 1:
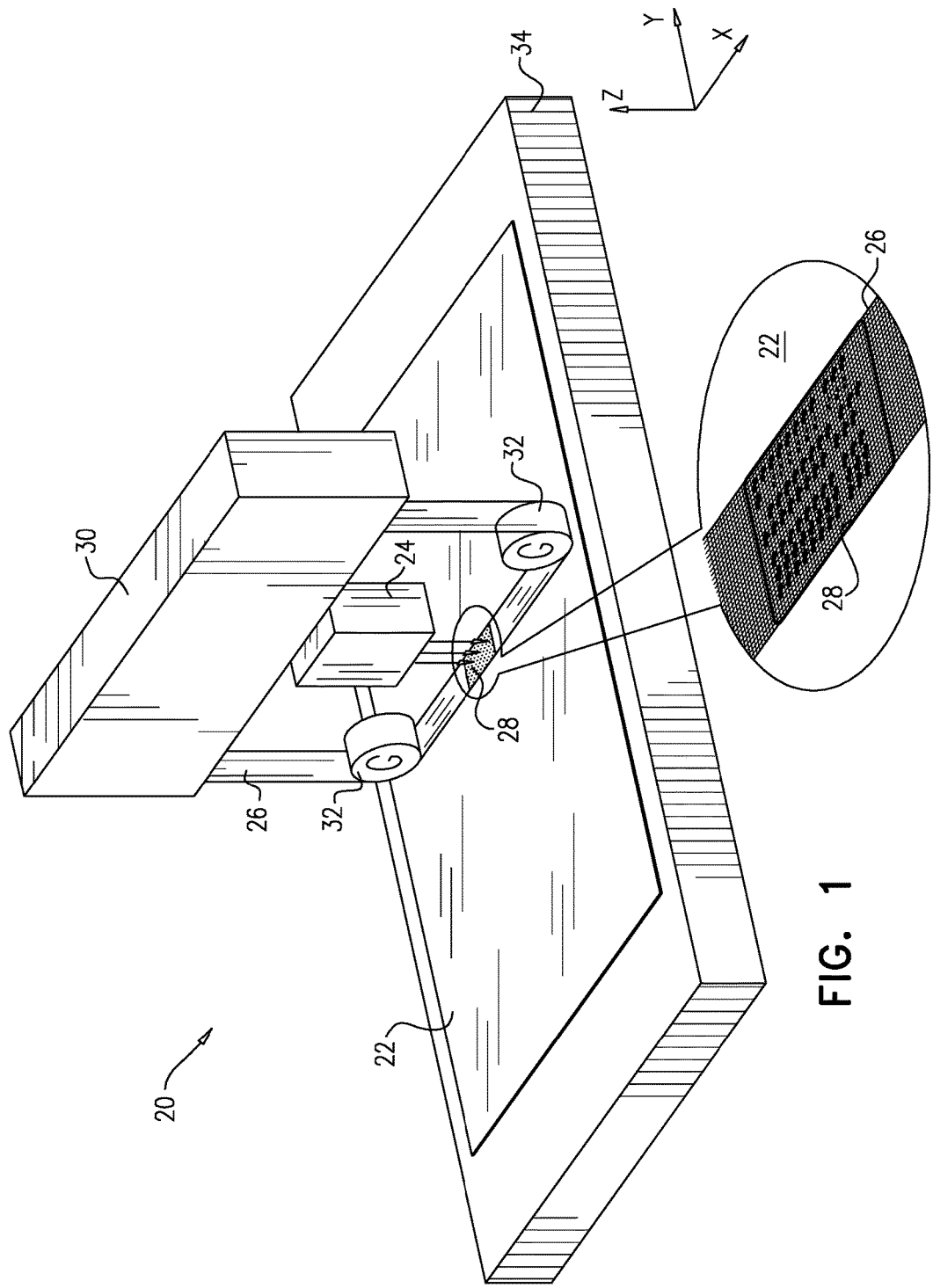
FIG. 1 is schematic, pictorial illustration of a LIFT-based printing system, in accordance with an embodiment of the present invention.

Embodiments of the present invention that are described herein provide LIFT-based systems that are capable of printing patterns in a wide range of donor materials, on a wide variety of different substrates, with high throughput. These embodiments make use of multiple laser beams simultaneously to write predefined patterns from a donor area of a donor film onto a target area of an acceptor substrate.

In the disclosed embodiments, a donor supply assembly positions a transparent donor substrate so that the surface of the donor substrate on which the donor film is formed is in proximity to the target area on the acceptor substrate. An optical assembly directs multiple output beams of laser radiation in the desired spatial pattern to pass simultaneously through the donor substrate and impinge on the donor film so as to induce ejection of material from the donor film onto the acceptor substrate, thereby writing the desired pattern onto the target area. The use of multiple writing beams simultaneously enables LIFT-based printing systems in accordance with embodiments of the present invention to operate at rates that are comparable to (or possibly greater than) those of high-speed inkjet printers that are known in the art, and far faster than existing LIFT-based systems.

The donor film may comprise, for example, a metal or a rheological material (which itself may contain metal), which is coated on one side of a transparent donor substrate. In a disclosed embodiment, the donor substrate comprises a continuous flexible donor foil, which is fed over feed rollers across the target area. To enable the use of different donor materials and adjustment of the donor composition and film thickness, the donor supply assembly typically comprises a coating module, which applies the donor film to an area of the continuous flexible foil as the foil is advanced through the donor supply assembly. At the same time, the donor supply assembly feeds another area of the donor foil, to which the donor film has already been applied, across the target area for use in the printing process itself.

The coating module may use a gravure process to apply the donor film to the foil, in which a gravure cylinder takes up donor material from a reservoir and spreads it across the surface of the foil as the foil is advanced through the coating module. More particularly, the donor film may be applied by micro-gravure, in which the direction of rotation of the gravure cylinder is such that the surface of the cylinder and the donor film advance in opposite directions in the area of contact between them. The term "gravure," in the present description and in the claims, should be understood as including both conventional gravure and micro-gravure implementations unless stated otherwise.

Typically, a positioning assembly shifts either the donor substrate or the acceptor substrate or both, so that the multiple output beams from the optical assembly write patterns on multiple target areas of the acceptor substrate in succession. When a continuous donor foil is used, as described above, the foil is advanced, in either a continuous or a stepwise motion, from one target area to the next. In the stepwise mode, the positioning assembly may hold the donor and acceptor substrates in fixed relative positions while the optical assembly writes the spatial patterns in the successive target areas as two-dimensional arrays of spots. Alternatively, the positioning assembly may cause a continuous relative shift between the donor and acceptor substrates as the optical assembly writes successive lines of the spatial patterns.

In the disclosed embodiments, the optical assembly comprises a laser, which emits a single input beam, and optics that split the single input beam into the multiple output beams and direct (or "steer") the output beams toward the target area in accordance with predefined spatial patterns.

Typically, the optics comprise an acousto-optic deflector and a driver, which provides a multi-frequency drive to the acousto-optic deflector, so that the acousto-optic deflector splits the input beam into the multiple output beams, while deflecting the output beams at different, respective angles. (Thus, the term "optics," as used in the present description and in the claims, should be understood as comprising both passive and active optical elements, such as acousto-optic elements.) The deflection angles of the output beams from the acousto-optic deflector may be fixed or variable. In one embodiment, the acousto-optic deflector deflects the beams in one direction, while one or more scanning mirrors deflect the output beams in a second, orthogonal direction. Alternatively, the optics may comprise a pair of orthogonal acousto-optic deflectors, in which case the scanning mirror may not be required. Further alternatively, scanning mirrors or other sorts of scanners that are known in the art may be to scan the beams in both directions.

FIG. 1 is schematic, pictorial illustration of a LIFT-based printing system 20, in accordance with an embodiment of the present invention. System 20 comprises a multi-beam optical assembly 24, which writes predefined patterns on an acceptor substrate 22 by laser-induced material transfer from a donor substrate, which has the form of a continuous, transparent donor foil 26. Acceptor substrate 22 may comprise any suitable material, such as glass, ceramic, or plastic, as well as other dielectric, semiconducting, or even conductive materials.

As explained in greater detail with reference to the figures that follow, a donor supply assembly 30 coats the lower (outer) surface of foil 26 with a donor film and feeds the coated foil across a target area 28 on feed rollers 32. The lower surface, on which the donor film is formed, is positioned in proximity to the target area on acceptor substrate 28. Optical assembly 24 directs multiple output beams of laser radiation in a predefined spatial pattern to pass simultaneously through the upper surface of donor foil 26 and thus impinge on the donor film on the lower surface. The laser is typically controlled to output a train of pulses of a suitable wavelength, duration and energy so as to induce ejection of material from the donor film onto acceptor substrate 22. The choice of laser beam parameters depends, inter alia, on the composition and thickness of the donor film. By sweeping the beams across target area 28 and controlling which beams to pulse at each location, optical assembly 24 is able to write substantially any suitable pattern onto the target area of the acceptor substrate.

System 20 comprises a positioning assembly, which may comprise an X-Y stage 34, for example, on which acceptor substrate 22 is mounted. Stage 34 shifts acceptor substrate 22 relative to optical assembly 24 and donor supply assembly 30 to enable system 20 to write spatial patterns on different target areas 28 over the surface of the acceptor substrate. Additionally or alternatively, the positioning assembly may comprise motion components (not shown) that shift optical assembly 24, as well as donor supply assembly 30, if appropriate, over the surface of the acceptor substrate. Typically, feed rollers 32 advance foil 26 in order to provide a fresh area of the donor film over target area 28 at each location at which a pattern is to be written. Optical assembly 24 is typically programmed and controlled to write different spatial patterns on different target areas.

System 20 may be used to print a wide range of different donor materials from foil 26 onto substrate 22. For example, the donor materials may comprise rheological materials, such as metal pastes (silver, copper or nickel, among other metals) or ceramic pastes. Additionally or alternatively, the donor materials on film 26 may comprise metal or dielectric inks, including modified metal and dielectric inks with additives to provide controlled viscosity. Further additionally or alternatively, the donor materials may include viscous adhesives, conductive adhesives, or other pastes, such as solder pastes. The metal pastes or inks may comprise pure metals or metal alloys. Non-conducting solids, such as polymers, oligomers or monomeric solutions, may be incorporated in the donor materials, as well.

These donor materials may be coated onto a wide variety of donor foils for use in system 20. For example, foil 26 may comprise polymeric materials such as PET, PEN, polyimide, or PEEK. The polymeric foils may be smooth or structured (for example, with indentations in the foil). Alternatively, donor foil 26 may comprise a thin, flexible glass. The foil may be coated with a single layer or multiple layers, for example with a thin transparent dielectric layer, or a thin metal layer, or a combination of such layers.

System 20 may similarly be used to print on a wide range of different acceptor types. Typically, system 20 as shown in the figures is used for printing on flat acceptor substrates, such as glass, polymer foils (such as PET, PEN, Polyimide, or PEEK), thermosets, or printed circuit substrates (which may be epoxy based, epoxy composites, or glass/epoxy, such as FR4). Additionally or alternatively, system 20 may be used for printing on paper, including different types of papers, with various surface treatments for applications such as packaging. The paper surface treatment may include thin coatings with organic layers. Further additionally or alternatively, system 20 may be used to print on other sorts of substrates, such as ceramic substrates, metal foils, or composites. As a further alternative, the system may be modified to print on substrates that are not flat, including curved substrates made of the some of the above-mentioned materials (molded plastics, polymeric foils, molded ceramics, etc.)

Given these different donor and acceptor types, it can be seen that system 20 may be used in a wide range of applications. A few representative examples include:

Printing metal tracks or conductive circuits using metal inks and pastes or solid metal.

Printing adhesives for connecting parts, devices and other elements to substrates.

Printing solder pastes for soldering elements to substrates.

Printing dielectrics (ceramics inks or pastes, or polymers, oligomers or monomers, for example) as structural materials.

Printing compositions of materials for generating composite structures.

Further details regarding two typical applications are presented below:
a. A PET foil, 50 μm thick, is coated with a metal viscous nanoparticle paste (silver or copper), with typical thickness between ~5 μm and ~40 μm (or 50 μm). The coating process is done in situ using method technique such as micro-gravure (as described below) or slot-die coating, which provides well-controlled layer thickness. Variability is typically <5% and can be reduced by appropriate thickness monitoring.
b. A polyimide foil is coated with a thin dielectric layer (such as alumina) and a metal layer, such as copper, with thickness from 0.5 μm to ~3 μm. In this case, rolls of coated foils are provided in advance and mounted on donor supply assembly 30. For coating of a thin metal layer on the foil, either sputtering or evaporation thermal evaporation) may be used. For thicker donor foils, >0.5 μm or 1 μm, an additional coating process may be used to thicken the thin metal layer, typically by a solution-based process, such as electroplating in a rolling foil mode in an electroplating bath. This approach allows the production of long rolls at a low cost. When an intermediate layer is needed, such as a transparent protective coating on the foil (prior to the metal overlayer), it can be applied by evaporation or sputtering, as is known the art.

The beam parameters of optical assembly 24 are dictated by the type of material to be printed (rheological or solid, metal or dielectric) and the donor film thickness, and are chosen so as to give the required droplet size and good printing quality. For example, when printing metal using a nanosecond laser pulse and a metal layer of thickness 0.5 μm to 1 μm on donor film 26, optical assembly 24 may typically be adjusted to give a spot size of 20 μm to 30 μm on film 26 with pulse energy of 3 μJ to 10 μJ using a green or UV laser source.

Figure 2A:
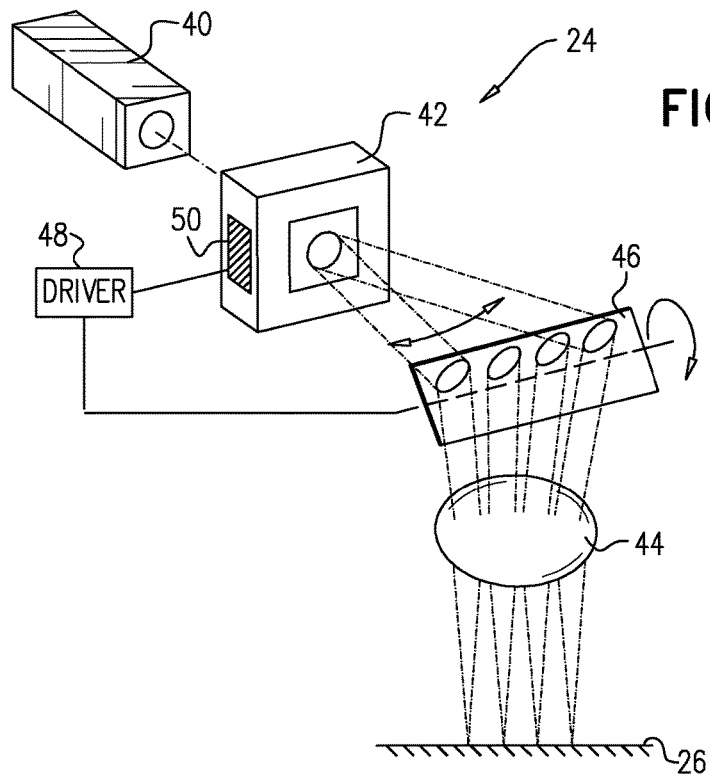
FIG. 2A is a schematic, pictorial illustration of an optical assembly used in a LIFT-based printing system, in accordance with an embodiment of the present invention.

FIG. 2A is a schematic, pictorial illustration showing details of optical assembly 24, in accordance with an embodiment of the present invention. A laser 40 emits a single, pulsed beam of optical radiation, which may comprise visible, ultraviolet or infrared radiation. An acousto-optic deflector 42 splits the input beam into multiple output beams. At least one scanning mirror 46 scans the beams over foil 26 via a scan lens 44. A multi-frequency drive circuit 48 applies a drive signal to a piezoelectric crystal 50, which drives deflector 42 in order to generate acoustic waves in the deflector that split the input beam. Although only a single mirror 46 is shown in FIG. 2, alternative embodiments (not shown in the figures) may employ dual maxis mirrors, which may be scanned together or independently, and/or any other suitable type of beam scanner that is known in the art.

Drive circuit 48 may drive acousto-optic deflector 42 in various different modes in order to generate the multiple output beams. A number of suitable drive techniques, along with ancillary focusing and scanning optics, that may be adapted for use in optical assembly 24 are described, for example, in U.S. Pat. No. 8,395,083, whose disclosure is incorporated herein by reference. In accordance with one of these techniques, drive circuit 48 generates a multi-frequency drive signal, which causes the acousto-optic deflector to diffract the input beam into multiple output beams at different, respective angles. Further details of this sort of multi-frequency drive are described by Hecht in "Multifrequency Acoustooptic Diffraction," *IEEE Transactions on Sonics and Ultrasonics* SU-24, pages 7-18 (1977), which is incorporated herein by reference; and by Antonov et al. in "Efficient Multiple-Beam Bragg Acoustooptic Diffraction with Phase Optimization of a Multifrequency Acoustic Wave," *Technical Physics* 52:8, pages 1053-1060 (2007), which is likewise incorporated herein by reference.

Figure 2B:
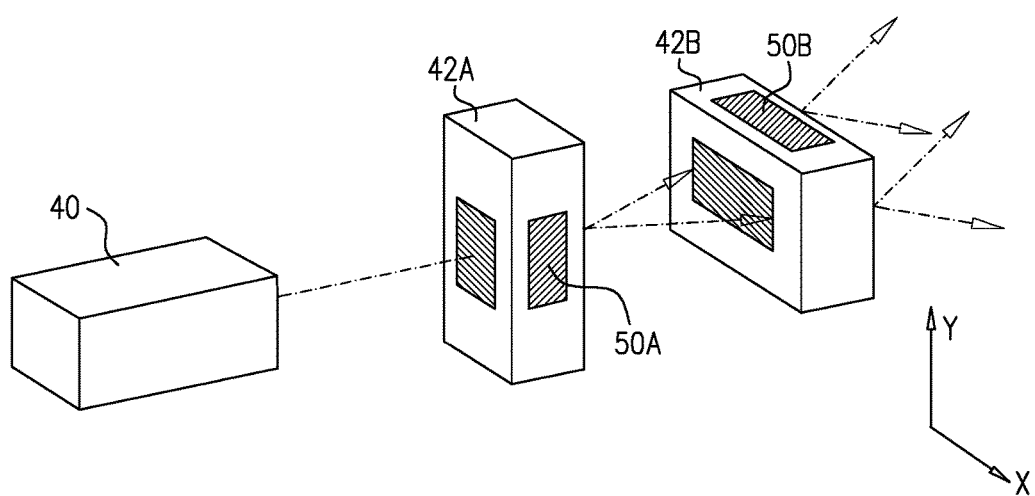
FIG. 2B is a schematic, pictorial illustration of an optical assembly used in a LIFT-based printing system, in accordance with another embodiment of the present invention.

FIG. 2B is a schematic, pictorial illustration of another optical assembly 25, in accordance with an alternative embodiment of the present invention. Assembly 25 may be used in place of assembly 24 in system 20. In assembly 25, a first acousto-optic deflector 42A splits the input beam from laser 40 into multiple output beams, which are separated in the X-direction. A second acousto-optic deflector 42B scans the beams in the orthogonal Y-direction. Alternatively, deflector 42A may scan the beam in the X-direction, while deflector 42B is driven to split the beam into multiple output beams that are separated in the Y-direction. Deflectors 42A and 42B are driven by respective piezoelectric crystals 50A and 50B. This arrangement has the advantages, relative to assembly 24, of greater versatility and steering speed, though at the cost of higher losses.

Figure 3:
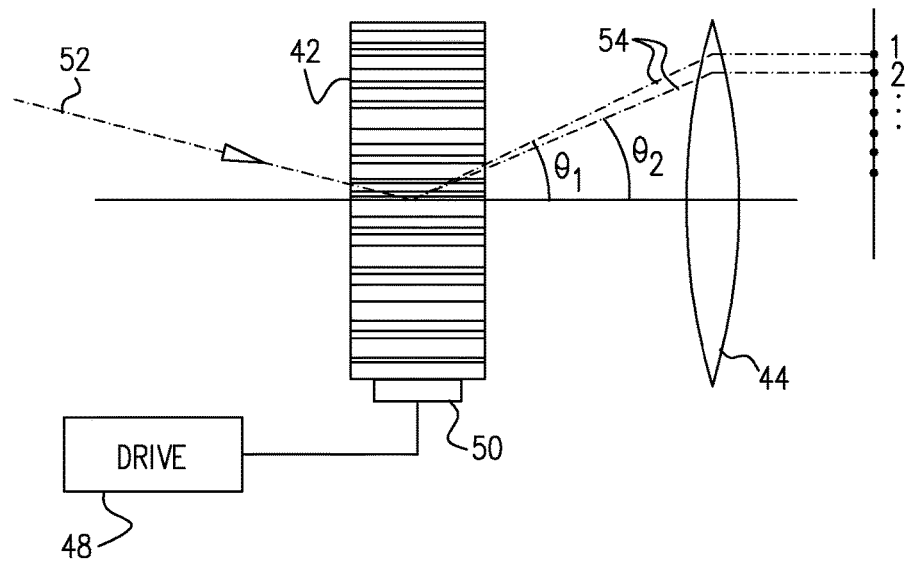
FIG. 3 is a schematic sectional view of an acousto-optic deflector used in generating multiple beams for LIFT printing, in accordance with an embodiment of the present invention.

FIG. 3 is a schematic sectional view of acousto-optic deflector 42, in accordance with an embodiment of the present invention. This figure illustrates the effect and operation of a multi-frequency drive, comprising drive circuit 48 and piezoelectric crystal 50. The multi-frequency drive signal from circuit 48 causes piezoelectric crystal 50 to generate acoustic waves at the multiple drive frequencies, which propagate through the acousto-optic crystal in deflector 42. Each of the different drive frequencies establishes an acousto-optic diffraction grating in the crystal at a corresponding spatial frequency, i.e., the crystal contains multiple superposed gratings of different spatial frequencies.

When an input beam 52 enters deflector 42, each of the gratings in the crystal diffracts the input beam at a different angle, depending on the grating frequency. Thus, deflector 42 splits input beam 52 into multiple output beams 54 at different angles $\theta_1, \theta_2, \ldots$, corresponding to the different frequencies $f_1, f_2, \ldots$. Optics 44 collimate and focus the output beams to form a corresponding array of spots 1, 2, ..., on foil 26. By modulating the amplitudes of the signals at the corresponding frequencies, in appropriate synchronization with the pulses of input beam 52, drive circuit 48 controls the intensity of the corresponding output beams 54 generated by each pulse of the input beam. More particularly, drive circuit 48 may turn the corresponding frequency components on and off in order to choose the combination of output beams 54 to generate at each pulse.

Figure 4:
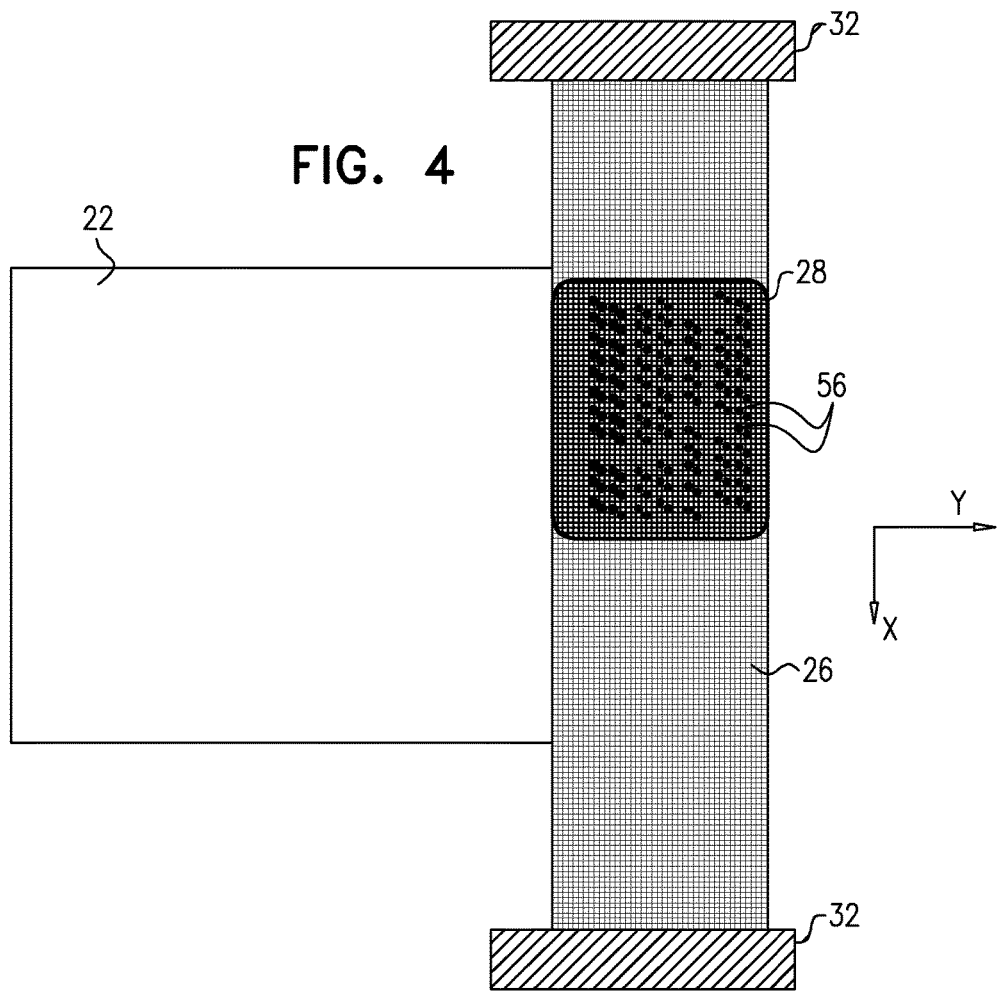
FIG. 4 is a schematic top view of a pattern written by multi-beam scanning in a LIFT-based printing system, in accordance with an embodiment of the present invention.

FIG. 4 is a schematic top view of a pattern of spots 56 written in target area 28 by system 20, in accordance with an embodiment of the present invention. Each spot 56 comprises material deposited on acceptor substrate 22 by ejection of the material from the donor film on foil 26, due to a corresponding output beam 54. In this embodiment, it is assumed that acousto-optic deflector 42 is oriented so that output beams 54 (and hence the spots 56 that are written due to each pulse from laser 40) are arrayed in a row across target area 28 in the X-direction. Mirror 46 scans the array of beams 54 across target area 28 in the Y-direction, thus creating a two-dimensional matrix of spots, in a spatial pattern defined by the signals from drive circuit 48. Alternatively, deflector 42 may be oriented to create rows of spots arrayed in the Y-direction, while mirror 46 scans in the X-direction.

Foil 26 and acceptor substrate 22 may be held stationary, in fixed relative positions, while optical assembly 24 writes the respective pattern on target area 28. Stage 34 may then shift acceptor substrate 22 to locate the next target area in the beam path of optical assembly 24, and feed rollers 32 advance foil 26 to provide a new area of donor film for ejection by output beams 54. This sort of area-by-area scanning mode is suitable for all sorts of donor films, including rheological compounds, as well as metal inks and pastes, for example.

Optionally, donor supply assembly 30 may successively position at least two different areas of foil 26 in proximity to the same target area 28. (The two areas may be coated with the same or different donor materials.) Optical assembly directs the multiple output beams over the two donor areas in respective, typically different spatial patterns, and is thus able to write multi-layer patterns the target area. In this manner, system 20 may be used to build up three-dimensional structures on one or more areas of acceptor substrate 22.

In an alternative embodiment, acousto-optic deflector 42 may be oriented so that the rows of spots 56 due to each pulse of input beam 52 are arrayed along the Y-direction. The positioning assembly of system 20 (including stage 34 and/or motion components that shift optical assembly 24) shifts target area 28 continuously in the X-direction as the optical assembly writes successive lines of spots, in accordance with the appropriate, predefined spatial pattern. Feed rollers 32 may operate continuously, as well, to feed foil 26 over acceptor substrate 22 as optical assembly 24 writes the successive lines of the pattern. This latter embodiment is suitable for materials that are ejected rapidly upon absorption of the pulses of beams 54 in the donor film but may be less appropriate for rheological materials with slower response times.

Figure 5:
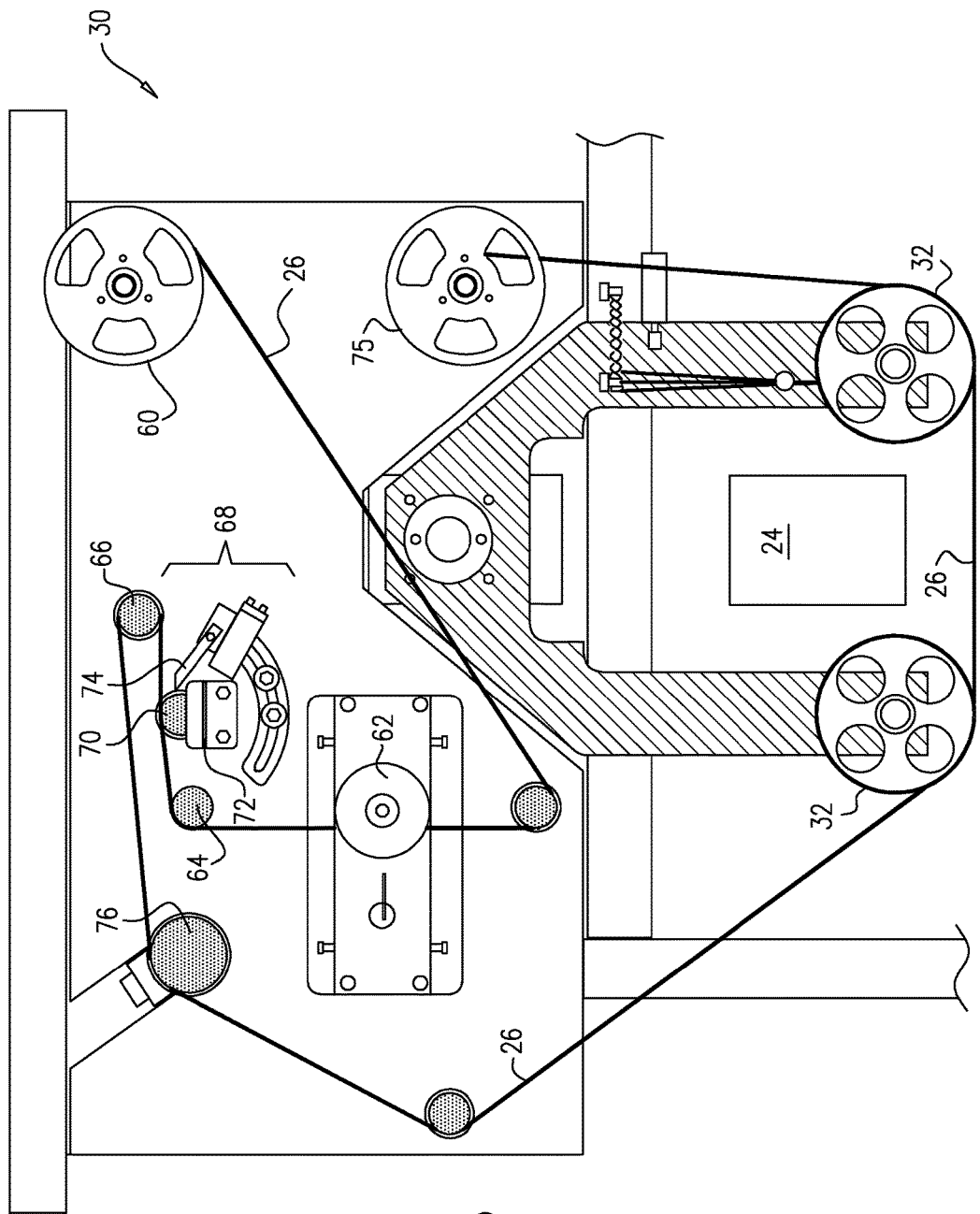
FIG. 5 is a schematic frontal view of a donor supply assembly used in a LIFT-based printing system, in accordance with an embodiment of the present invention.

FIG. 5 is a schematic frontal view of donor supply assembly 30, in accordance with an embodiment of the present invention. An unwind roller 60 provides a continuous supply of uncoated flexible foil 26, which is fed through a cleaning module 62 to a coating module 68. Cleaning module 62 may comprise, for example, a plasma cleaning tool, which removes residual material from foil 26 to ensure good wetting by the coating donor material and good adhesion of the film. Coating module 68 applies the donor film to the outer surface of foil 26.

After the foil has been coated it is advanced to feed rollers 32, which feed the coated foil over the target area. In other words, at the same time as a given, coated area of the foil serves as the target for optical assembly 24, another part of the same foil is being coated by module 68 to serve as a subsequent target. Wrap adjustment rollers 64 and 66 maintain the proper position and tension of foil 26 as it passes through coating module 68. A tension measurement gauge 76 measures the tension of the foil to ensure that the foil is held straight and at the proper position both within the coating module and in the target area (at the bottom of the figure). A rewind roller 75 takes up the used foil, which may subsequently be cleaned and reused. The donor material that is stripped from the used foil may itself be recycled, as well.

Coating module 68 may apply a gravure process (more specifically, micro-gravure in the present embodiment) in applying the donor film to foil 26. The coating module comprises a reservoir 72, which contains a supply of the desired donor material. The reservoir may be heated if necessary. A micro-gravure cylinder 70 (which rotates in a direction opposite to the feed direction of foil 26) picks up a thin layer of the donor material from reservoir 72 as it rotates. An adjustable doctor blade 74 removes excess material from cylinder 70. As the cylinder comes into contact with foil, it then deposits a thin, uniform layer of the donor material from the reservoir onto the foil in order to form the donor film. Gravure processes of this sort, and particularly micro-gravure, are suitable for coating the foil with a wide range of different inks and pastes. Alternatively, coating module 68 may apply other coating techniques that are known in the art, such as slot-die or bar coating.

In an alternative embodiment (not shown in the figures), foil 26 may comprise a single, continuous loop. In this case, the used foil is fed around a wheel at the location of roller 75 directly to cleaning module 62, which removes residual donor film from the foil. Coating module 68 applies a fresh film to the clean foil, which is then printed onto the acceptor substrate as described above.

As a further alternative, other sorts of donor substrates and substrate feed mechanisms may be used in conjunction with optical assembly 24 in multi-beam LIFT printing on acceptor substrate 22, as well as on acceptor surfaces of other types. For example, the foil may be prepared and coated in advance, rather than by in situ coating as in FIG. 5. (This sort of approach is appropriate particularly for thin film metal coatings or other solid layer coatings, for example a dielectric material layer, a solid polymer, or a phase change material, such as a wax.)

As another example, two different donor materials may be coated on alternating areas of the foil in succession, such as alternating conducting and non-conducting materials, in order to print the different donor materials in succession onto the acceptor substrate. This sort of donor film may be prepared in advance, or the foil may be coated by modifying donor supply assembly 30 to include two coating modules, using micro-gravure or other coating techniques, such as slot-die coating, that operate in alternation.

As still another example, the foil may be pre-coated with a layer of one donor material, such as a metal layer, and an additional layer may be coated in-situ by donor supply assembly 30 over the pre-coated layer. This additional layer may be coated in a continuous manner or intermittently, as needed. This approach may be used, for example, to print a metal along with an additional material onto the acceptor substrate. It can be used in LIFT printing of multi-composition structures, as described in PCT International Publication WO 2015/056253, whose disclosure is incorporated herein by reference.

Further alternatively, other sorts of donors, not necessarily foil- and roller-based—may be used, mutatis mutandis.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. Printing apparatus, comprising:
    a donor supply assembly, which is configured to provide a transparent donor substrate having opposing first and second surfaces and a donor film formed on the second surface so as to position the donor film in proximity to a target area on an acceptor substrate,
    wherein the donor substrate comprises a continuous flexible foil, and wherein the donor supply assembly comprises feed rollers, which are configured to feed the foil across the target area, and
    wherein the donor supply assembly comprises a coating module, which is configured to apply at least a component of the donor film to a first area of the continuous flexible foil while a second area of the continuous flexible foil, to which the donor film has already been applied, is fed across the target area, and
    wherein the coating module is configured to apply different, respective donor materials to alternating areas of the foil in succession; and
    an optical assembly, which is configured to direct multiple output beams of laser radiation simultaneously in a predefined spatial pattern to pass through the first surface of the donor substrate and impinge on the donor film so as to induce ejection of material from the donor film onto the acceptor substrate according, thereby writing the predefined pattern onto the target area of the acceptor substrate.

2. The apparatus according to claim 1, wherein the donor film comprises a metal.

3. The apparatus according to claim 1, wherein the donor film comprises a rheological material.

4. The apparatus according to claim 1, wherein the optical assembly comprises a laser, which is configured to emit a single input beam, and optics configured to split the single input beam into the multiple output beams and to direct the multiple output beams in accordance with the predefined spatial pattern.

5. The apparatus according to claim 4, wherein the optics comprise an acousto-optic deflector, which is positioned so as to intercept the input beam, and a driver, which is configured to provide a multi-frequency drive to the acousto-optic deflector so as deflect the multiple output beams at different, respective angles.

6. The apparatus according to claim 5, wherein the acousto-optic deflector is configured to deflect the multiple output beams at the respective angles along a first direction, and wherein the optics comprise at least one scanning mirror, which is configured to deflect the multiple output beams in a second direction, orthogonal to the first direction.

7. The apparatus according to claim 5, wherein the acousto-optic deflector that receives the multi-frequency drive comprises a first acousto-optic deflector, which is configured to deflect the multiple output beams at the respective angles along a first direction, and wherein the optics comprise a second acousto-optic deflector, which is configured to cause the multiple output beams to scan over the donor film in a second direction, orthogonal to the first direction.

8. The apparatus according to claim 1, and comprising a positioning assembly, which is configured to shift at least one of the donor substrate and the acceptor substrate in order to position a first donor area of the donor film in proximity to a first target area of the acceptor substrate, so that the multiple output beams write a first predefined spatial pattern onto the first target area, and subsequently to position at least one second donor area of the donor film, different from the first donor area, in proximity to at least one second target area of the acceptor substrate, different from the first target area, so that the multiple output beams write at least one second predefined spatial pattern onto the second target area.

9. The apparatus according to claim 8, wherein the positioning assembly is configured to hold the donor and acceptor substrates in fixed, first and second relative positions while the optical assembly writes the first and second spatial patterns, respectively, as two-dimensional arrays of spots on the first and second target areas of the acceptor substrate.

10. The apparatus according to claim 8, wherein the positioning assembly and donor supply assembly are configured to cause a relative shift between the donor and acceptor substrates as the optical assembly writes successive lines of the first and second spatial patterns.

11. The apparatus according to claim 8, wherein the positioning assembly is configured to successively position at least first and second donor areas of the donor film in proximity to at least the first target area, and wherein the optical assembly is configured to direct the multiple output beams over the first and second donor areas in respective first and second spatial patterns so as to write a multi-layer pattern on at least the first target area.

12. The apparatus according to claim 1, wherein the coating module comprises a reservoir containing a donor material and a gravure cylinder, which is configured to apply a layer of the donor material from the reservoir to the first area of the foil in order to form the donor film.

13. Printing apparatus, comprising:
a donor supply assembly, which is configured to provide a transparent donor substrate having opposing first and second surfaces and a donor film formed on the second surface so as to position the donor film in proximity to a target area on an acceptor substrate,
wherein the donor substrate comprises a continuous flexible foil, and wherein the donor supply assembly comprises feed rollers, which are configured to feed the foil across the target area, and
wherein the donor supply assembly comprises a coating module, which is configured to apply at least a component of the donor film to a first area of the continuous flexible foil while a second area of the continuous flexible foil, to which the donor film has already been applied, is fed across the target area; and
an optical assembly, which is configured to direct multiple output beams of laser radiation simultaneously in a predefined spatial pattern to pass through the first surface of the donor substrate and impinge on the donor film so as to induce ejection of material from the donor film onto the acceptor substrate according, thereby writing the predefined pattern onto the target area of the acceptor substrate,
wherein the donor film comprises a first donor material, which is pre-coated on the foil, and wherein the coating module is configured to apply a second donor material to the pre-coated foil, so that the donor film comprises the first and second donor materials.

14. A method for printing, comprising:
positioning a transparent donor substrate, having opposing first and second surfaces and a donor film formed on the second surface, in proximity to a target area on an acceptor substrate,
wherein the donor substrate comprises a continuous flexible foil, and wherein positioning the transparent donor substrate comprises feeding the foil across the target area on feed rollers;
applying at least a component of the donor film to a first area of the continuous flexible foil while a second area of the continuous flexible foil, to which the donor film has already been applied, is fed across the target area,
wherein the donor film comprises a first donor material, which is pre-coated on the foil, and wherein applying at least the component of the donor film comprises applying a second donor material to the pre-coated foil, so that the donor film comprises the first and second donor materials; and
directing multiple output beams of laser radiation simultaneously in a predefined spatial pattern to pass through the first surface of the donor substrate and impinge on the donor film so as to induce ejection of material from the donor film onto the acceptor substrate according, thereby writing the predefined pattern onto the target area of the acceptor substrate.

15. The method according to claim 14, wherein the donor film comprises a metal.

16. The method according to claim 14, wherein the donor film comprises a rheological material.

17. The method according to claim 14, wherein directing the multiple output beams comprises splitting a single input beam into the multiple output beams and directing the multiple output beams in accordance with the predefined spatial pattern.

18. The method according to claim 17, wherein splitting the single input beam comprises directing the input beam through an acousto-optic deflector, while driving the acousto-optic deflector with a multi-frequency drive so as deflect the multiple output beams at different, respective angles.

19. The method according to claim 18, wherein directing the multiple output beams comprises deflecting the multiple output beams at the respective angles along a first direction using the acousto-optic deflector, and deflecting the multiple output beams in a second direction, orthogonal to the first direction, using a scanning mirror.

20. The method according to claim 18, wherein directing the multiple output beams comprises deflecting the multiple output beams at the respective angles along a first direction using a first acousto-optic deflector, which is configured to deflect the multiple output beams at the respective angles along a first direction, and causing the multiple output beams to scan over the donor film in a second direction, orthogonal to the first direction using a second acousto-optic deflector.

21. The method according to claim 14, and comprising shifting at least one of the donor substrate and the acceptor substrate in order to position a first donor area of the donor film in proximity to a first target area of the acceptor substrate, so that the multiple output beams write a first predefined spatial pattern onto the first target area, and subsequently to position at least one second donor area of the donor film, different from the first donor area, in proximity to at least one second target area of the acceptor substrate, different from the first target area, so that the multiple output beams write at least one second predefined spatial pattern onto the second target area.

22. The method according to claim 21, wherein shifting the at least one of the donor substrate and the acceptor substrate comprises holding the donor and acceptor substrates in fixed, first and second relative positions while the optical assembly writes the first and second spatial patterns, respectively, as two-dimensional arrays of spots on the first and second target areas of the acceptor substrate.

23. The method according to claim 21, wherein shifting the at least one of the donor substrate and the acceptor substrate comprises causing a relative shift between the donor and acceptor substrates as the optical assembly writes successive lines of the first and second spatial patterns.

24. The method according to claim 21, wherein shifting the at least one of the donor substrate and the acceptor substrate comprises successively positioning at least first and second donor areas of the donor film in proximity to at least the first target area, and wherein directing the multiple output comprises directing the output beams over the first and second donor areas in respective first and second spatial patterns so as to write a multi-layer pattern on at least the first target area.

25. The method according to claim 14, wherein applying at least the component of the donor film comprises coating a layer of donor material onto the flexible foil using a gravure process.

26. A method for printing, comprising:
positioning a transparent donor substrate, having opposing first and second surfaces and a donor film formed on the second surface, in proximity to a target area on an acceptor substrate,
wherein the donor substrate comprises a continuous flexible foil, and wherein positioning the transparent donor substrate comprises feeding the foil across the target area on feed rollers;
applying at least a component of the donor film to a first area of the continuous flexible foil while a second area of the continuous flexible foil, to which the donor film has already been applied, is fed across the target area; and
directing multiple output beams of laser radiation simultaneously in a predefined spatial pattern to pass through the first surface of the donor substrate and impinge on the donor film so as to induce ejection of material from the donor film onto the acceptor substrate according, thereby writing the predefined pattern onto the target area of the acceptor substrate,
wherein applying at least the component of the donor film comprises applying different, respective donor materials to alternating areas of the foil in succession.

\* \* \* \* \*